(12) United States Patent
Suzuki et al.

(10) Patent No.: US 11,437,338 B2
(45) Date of Patent: Sep. 6, 2022

(54) SEMICONDUCTOR DEVICE, SINTERED METAL SHEET, AND METHOD FOR MANUFACTURING SINTERED METAL SHEET

(71) Applicant: HITACHI, LTD., Tokyo (JP)

(72) Inventors: Tomohisa Suzuki, Tokyo (JP); Hiroshi Moriya, Tokyo (JP)

(73) Assignee: HITACHI, LTD., Tokyo (JP)

( * ) Notice: Subject to any disclaimer, the term of this patent is extended or adjusted under 35 U.S.C. 154(b) by 11 days.

(21) Appl. No.: 17/261,715

(22) PCT Filed: Mar. 20, 2019

(86) PCT No.: PCT/JP2019/011935
§ 371 (c)(1),
(2) Date: Jan. 20, 2021

(87) PCT Pub. No.: WO2020/026516
PCT Pub. Date: Feb. 6, 2020

(65) Prior Publication Data
US 2021/0265298 A1 Aug. 26, 2021

(30) Foreign Application Priority Data
Jul. 30, 2018 (JP) .............................. JP2018-142168

(51) Int. Cl.
*H01L 23/00* (2006.01)
*H01L 23/373* (2006.01)
(52) U.S. Cl.
CPC .......... *H01L 24/29* (2013.01); *H01L 23/3735* (2013.01); *H01L 24/27* (2013.01);
(Continued)

(58) Field of Classification Search
CPC . H01L 2224/27505; H01L 2224/03505; H01L 2224/838; H01L 2224/83801; H01L 2224/8384
See application file for complete search history.

(56) References Cited

U.S. PATENT DOCUMENTS

2017/0263586 A1\* 9/2017 Joshi ........................ H01L 24/32
2019/0103374 A1\* 4/2019 Kumada .................. H01L 24/27

FOREIGN PATENT DOCUMENTS

JP 2010-248617 A 11/2010
JP 2015-185559 A 10/2015
(Continued)

OTHER PUBLICATIONS

PCT/JP2019/011935 International Search Report, dated Apr. 23, 2019; 1 pg.

*Primary Examiner* — Julio J Maldonado
*Assistant Examiner* — Stanetta D Isaac
(74) *Attorney, Agent, or Firm* — Volpe Koenig

(57) ABSTRACT

A method utilized at a sintered metal layer bonding a semiconductor element and a support substrate together suppresses cracks appearing in the sintered metal layer, and damage to the semiconductor element. A semiconductor device includes a support substrate, a semiconductor element, and a sintered metal layer bonding the support substrate and the semiconductor element. The sintered metal layer has a low porosity region disposed inward of an outer edge of the semiconductor element with the sintered metal layer bonded to the semiconductor element. The region is lower in porosity than the remaining sintered metal layer, and is formed as a wall-shaped structural body having an elongated string and extending from an upper surface to a lower surface of the sintered metal layer. The low porosity region is disposed to surround a region immediately below (Continued)

a center of the semiconductor element along the outer edge of the semiconductor element.

7 Claims, 9 Drawing Sheets

(52) U.S. Cl.
CPC .... *H01L 24/32* (2013.01); *H01L 2224/27505* (2013.01); *H01L 2224/29239* (2013.01); *H01L 2224/29244* (2013.01); *H01L 2224/29247* (2013.01); *H01L 2224/29255* (2013.01); *H01L 2224/29269* (2013.01); *H01L 2224/32225* (2013.01); *H01L 2924/1033* (2013.01); *H01L 2924/10253* (2013.01); *H01L 2924/10272* (2013.01); *H01L 2924/1203* (2013.01); *H01L 2924/13055* (2013.01); *H01L 2924/15787* (2013.01); *H01L 2924/3512* (2013.01)

(56) References Cited

FOREIGN PATENT DOCUMENTS

| JP | 2015-216160 A | 12/2015 |
|----|---------------|---------|
| WO | 2014-155619 A1 | 10/2014 |

* cited by examiner

SEMICONDUCTOR DEVICE, SINTERED METAL SHEET, AND METHOD FOR MANUFACTURING SINTERED METAL SHEET

TECHNICAL FIELD

The present invention relates to a semiconductor device to be suitably used for a power converter and the like, a sintered metal sheet, and a method for manufacturing a sintered metal sheet.

BACKGROUND ART

In recent years, the market for power modules intended for power converters such as inverters has been growing in a variety of fields including electric vehicles and railways. Against the backdrop of growing awareness of environmental protection and energy saving, power modules have been required to achieve more efficient power conversion. However, Si power modules are approaching their limits as to an improvement in power conversion efficiency. For the purpose of more efficient power conversion, for example, SiC power modules have been developed as the next-generation power modules.

A SiC power module is capable of operating at a high temperature of 200° C. or more, and achieves considerable size reduction and weight reduction in addition to efficient power conversion. In a high-temperature environment of 200° C. or more, lead-free solder, which has been used as a chip bonding material, cannot be used due to a problem of remelting. Currently, high melting point solder with a lead content of 85% or more has been excluded from the Restriction of Hazardous Substances (RoHS). In the future, however, the high melting point solder will inevitably be subject to the RoHS. Therefore, the development of an alternative material to lead-free solder is an urgent necessity.

As an alternative material to lead-free solder, expectations have been placed on a sintered metal bonding material obtained by sintering metal particles of the order from nanometers to micrometers, and developments are being made in the sintering and bonding technology using silver (Ag) and copper (Cu). A bonding layer made of a sintered metal material has a porous structure containing holes as disclosed in, for example, PTL 1. In a power module for, for example, power conversion, a semiconductor element is bonded to a substrate with a sintered metal material, as disclosed in, for example, PTL 2.

PTL 1 also discloses a method including: placing, on a substrate, a sintered metal sheet prepared by heating and temporarily sintering a metal paste material as a mixture of metal fine particles with an organic solvent in advance; mounting a semiconductor element on the sintered metal sheet; heating and sintering the sintered metal sheet again; and bonding the semiconductor element to the substrate. PTL 2 also discloses a method including: applying, onto a substrate, a metal paste material as a mixture of metal fine particles with an organic solvent; mounting a semiconductor element on the metal paste material; sintering the metal paste material by heat; and bonding the semiconductor element to the substrate.

In particularly a power module and the like, a repetitive heat cycle owing to operation of a semiconductor element, an environmental temperature, and other conditions causes a difference in coefficient of thermal expansion between the semiconductor element and a sintered metal layer, which may result in thermal strain on the semiconductor element and the sintered metal layer. Owing to the heat strain, a crack appears in an end of the sintered metal layer, and runs in an in-plane direction of the sintered metal layer. As a result, the sintered metal layer loses functions such as thermal conduction and electric conduction, which may lead to a failure in the power module.

The sintered metal layer hardly undergoes cracking by increasing pressure at the time of sintering to reduce the porosity of the sintered metal layer. However, excessively high pressure at the time of sintering excessively increases the rigidity of the sintered metal layer, which may cause damage to peripheral members such as the semiconductor element.

In view of the circumstances described above, PTL 2 discloses a technique for forming a sintered metal layer of which the porosity is lower at a position closer to a periphery of a semiconductor element and is higher at a position closer to a center of the semiconductor element, by changing a thickness of a metal paste to be applied. The sintered metal layer has a peripheral edge formed rigid, so that a crack appearing in the peripheral edge hardly runs toward a center of the sintered metal layer. PTL 3 discloses a technique for forming, from two different metal pastes, a sintered metal layer having a low porosity region located on a periphery or a corner of a semiconductor element, the low porosity region being lower in porosity than a center of the sintered metal layer. PTL 4 discloses a technique for forming a sintered metal layer having a low porosity region in its outer edge or corner, by densifying a metal foam placed after application of a metal paste, by a sintering process.

CITATION LIST

Patent Literature

PTL 1: JP 2010-248617 A
PTL 2: JP 2015-216160 A
PTL 3: WO 2014/155619 A1
PTL 4: JP 2015-185559 A

SUMMARY OF INVENTION

Technical Problem

As described above, when a sintered metal layer is used as a bonding member for bonding a semiconductor element to a substrate, the porosity of the sintered metal layer is high, that is, the number of interstices in the sintered metal layer is large. As a result, a crack is apt to appear in a periphery or a corner of the sintered metal layer. Even when the porosity of the sintered metal layer is simply reduced, stress is concentratedly applied to an interface between the sintered metal layer and a semiconductor element. As a result, the semiconductor element is likely to be separated from the sintered metal layer at the interface.

In view of the circumstances described above, PTL 2, PTL 3, and PTL 4 each propose a sintered metal layer having a low porosity region located immediately below an outer edge of a semiconductor element. This case, however, causes an increase in stress to be applied to the outer edge of the semiconductor element. Owing to the increase of the stress, the sintered metal layer is likely to be separated from the outer edge of the semiconductor element, and the semiconductor element is damaged with a high probability.

PTL 4 mentions a sintered metal layer having a low porosity region located inward of an outer edge of a semiconductor element. The low porosity region is formed by printing a metal paste as a material, and then mounting another member (a metal foam) on the printed surface. It is therefore necessary to increase a size of a metal foam to be placed, to a degree that the metal foam is self-sustainable, from the viewpoint of mountability. That is, it is difficult to form a low porosity region in a fine pattern.

In view of the foregoing circumstances in the conventional art, an object of the present invention is to provide a semiconductor device capable of suppressing occurrence of separation, running of a crack, damage to a semiconductor element, and the like with high reliability, a sintered metal sheet, and a method for manufacturing a sintered metal sheet.

Solution to Problem

The present invention provides a semiconductor device including: a support substrate; a semiconductor element; and a sintered metal layer bonding the semiconductor element and the support substrate together, the sintered metal layer having a low porosity region disposed inward of an outer edge of the semiconductor element with the sintered metal layer bonded to the semiconductor element, the low porosity region being lower in porosity than a remaining region, except the low porosity region, of the sintered metal layer.

Advantageous Effects of Invention

The present invention provides a semiconductor device capable of suppressing occurrence of separation, running of a crack, damage to a semiconductor element, and the like with high reliability, a sintered metal sheet, and a method for manufacturing a sintered metal sheet.

DESCRIPTION OF EMBODIMENTS

Embodiments of the present invention will be described below in detail with reference to the drawings. In the respective drawings, common constituent elements are denoted with the same reference sign, and the redundant description thereof will not be given here.

First Embodiment

Figure 1A:
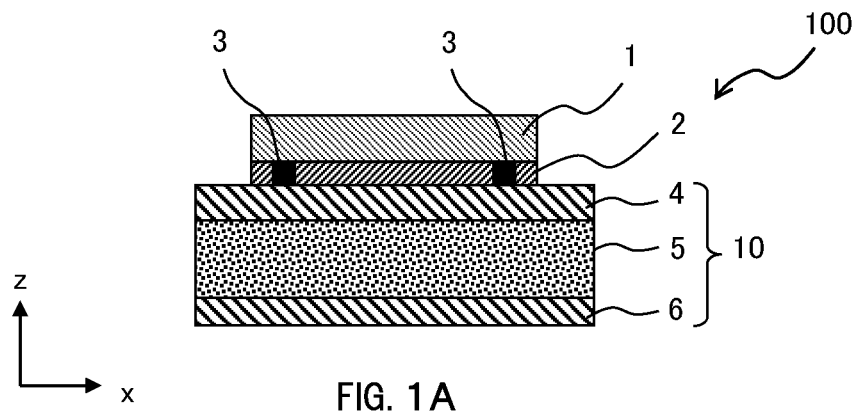
FIG. 1A illustrates an exemplary sectional structure of a semiconductor device according to a first embodiment of the present invention.
Figure 1B:
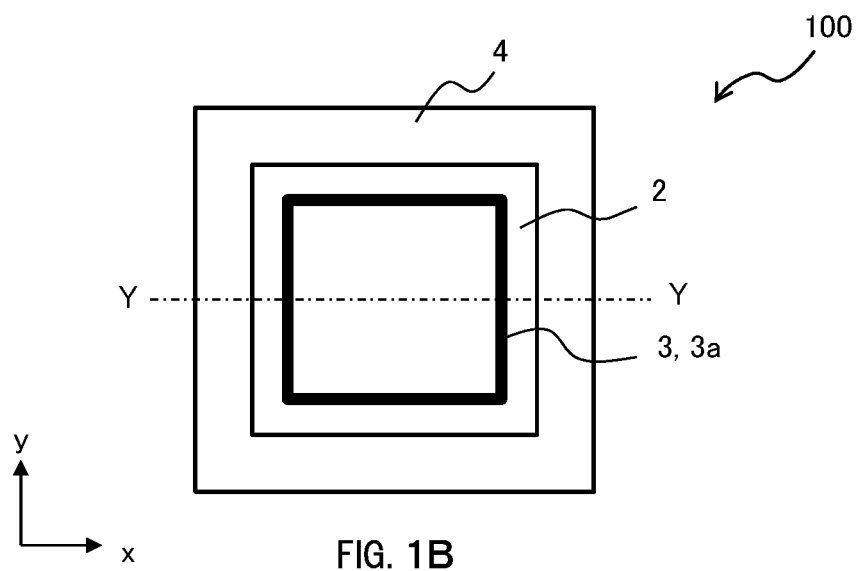
FIG. 1B illustrates an exemplary top view of the semiconductor device according to the first embodiment of the present invention.

FIG. 1A illustrates an exemplary sectional structure of a semiconductor device 100 according to a first embodiment of the present invention. FIG. 1B illustrates an exemplary top view of the semiconductor device 100 according to a first embodiment of the present invention. As illustrated in FIGS. 1A and 1B, the semiconductor device 100 has a configuration in which a semiconductor element 1 is bonded to a support substrate 10 with a sintered metal layer 2. The top view of FIG. 1B illustrates the semiconductor device 100 from which the semiconductor element 1 is removed. The sectional view of FIG. 1A illustrates the semiconductor device 100 including the semiconductor element 1, taken along line Y-Y in the plan view of FIG. 1B.

The semiconductor element 1 is an insulated gate bipolar transistor (IGBT), a diode, or the like for current control. The semiconductor element 1 is made of a semiconductor material such as silicon (Si), silicon carbide (SiC), or gallium nitride (GaN). Preferably, the semiconductor material to be used herein is a wide bandgap semiconductor with low power loss, such as silicon carbide (SiC) or gallium nitride (GaN).

The support substrate 10 has a multilayered structure of three layers, that is, a conductive member 4, an insulating member 5, and a cooling member 6. Each of the conductive member 4 and the cooling member 6 is made of a conductive material with high electric conductivity and thermal conductivity, such as copper (Cu) or aluminum (Al). The insulating member 5 is made of an insulating material such as aluminum nitride (AlN), silicon nitride (Si3N4), aluminum oxide (Al2O3), a resin sheet, or grease.

However, the sectional structure of the semiconductor device 100 is not limited to that described above. For example, the semiconductor element 1 may be surrounded with a sealing material. The sealing material to be used in such a structure is, for example, a silicone gel or an insulating material including a thermosetting resin such as an epoxy resin and a silica filler. The support substrate 10 may be composed of the conductive member 4 as a whole. In the semiconductor device 100 illustrated in FIG. 1A, a single semiconductor element 1 is bonded to the support substrate 10. Alternatively, the semiconductor device 100 may have a configuration in which a plurality of semiconductor elements 1 is bonded to a single support substrate 10.

The sintered metal layer 2 is made of a sintered metal bonding material obtained by sintering a paste material as a mixture of an organic solvent with metal fine particles of the order from nanometers to micrometers, such as Ag, Cu, Au, Ni, or Pt. Preferably, Ag or Cu is used as the metal fine particles in the paste material. The sintered metal bonding material thus obtained is a porous body having a large number of holes formed therein.

In the present embodiment, the sintered metal layer 2 has a low porosity region 3 that is lower in porosity than the remaining region. The low porosity region 3 has the following features. The low porosity region 3 is made of a sintered metal bonding material obtained by sintering a paste material that is equal in composition to the paste material for the sintered metal layer 2. The low porosity region 3 is lower in porosity than the remaining region. As illustrated in FIG. 1B, in the sintered metal layer 2, the low porosity region 3 is located inward of an outer edge of the semiconductor element 1 with the sintered metal layer 2 bonded to the semiconductor element 1. The low porosity region 3 extends along the outer edge of the semiconductor element 1 so as to be located around the outer edge of the semiconductor element 1. As illustrated in FIG. 1A, the low porosity region 3 extends from an upper surface to a lower surface of the sintered metal layer 2.

It can therefore be said in the present embodiment that the low porosity region 3 is a wall-shaped structural body that has an elongated string shape as seen in plan view and divides the sintered metal layer 2 into an outer high porosity region and an inner high porosity region as seen in plan view. The low porosity region 3 does not necessarily have a linear shape as seen in plan view. For example, the low porosity region 3 may have an undulated and curved shape. It is however preferable that the planar shape of the low porosity region 3 have a symmetrical pattern for avoiding biased deformation owing to stress.

Preferably, the porosity of the low porosity region 3 is lower than the porosity of the region except the low porosity region 3 in the sintered metal layer 2 by at least 10% or less. More preferably, the porosity of the low porosity region 3 is less than 10%. The low porosity region 3 has a single layer structure of which the porosity is fixed in a vertical direction (z-axis direction). However, the structure of the low porosity region 3 is not limited thereto. For example, the low porosity region 3 may have a multilayered structure of which the layers are different in porosity from one another.

Figure 2A:
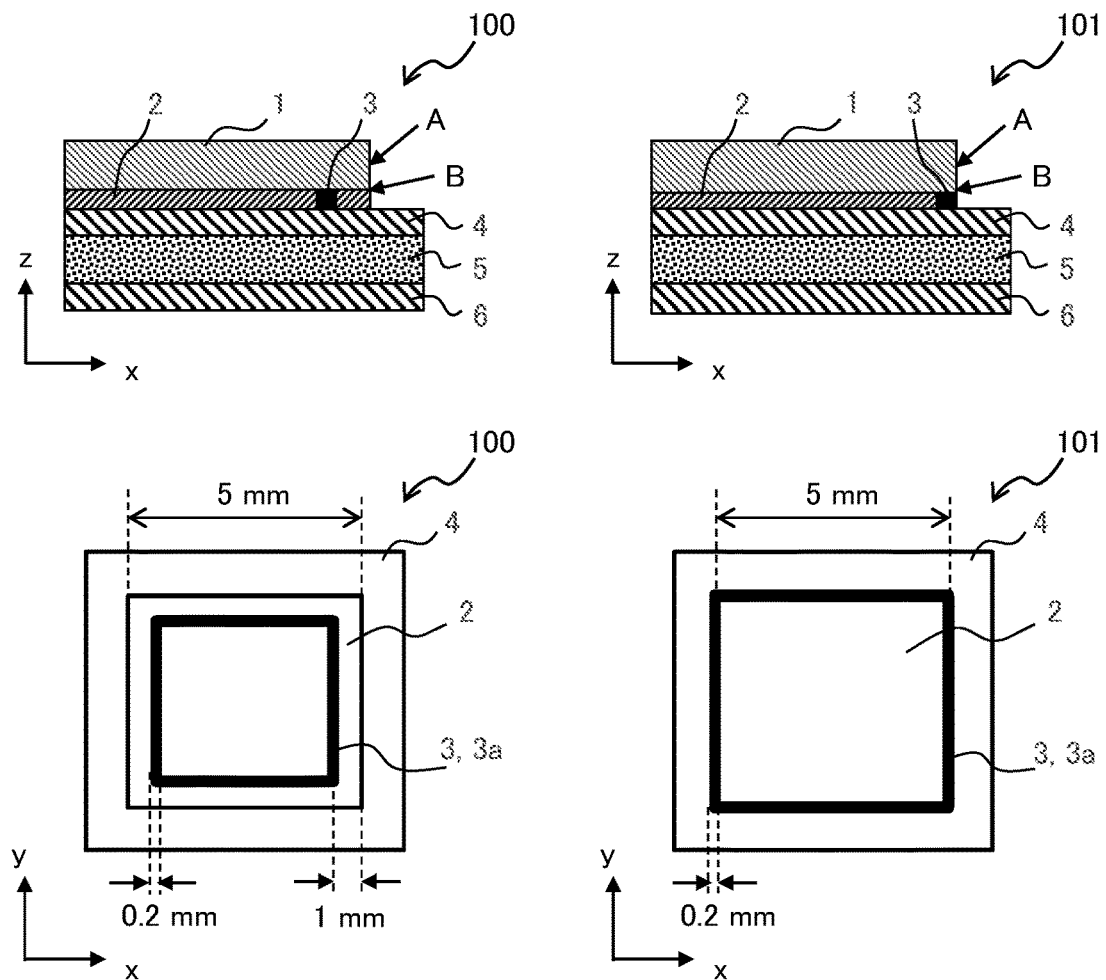
FIG. 2A illustrates a difference in structure between the semiconductor device according to the first embodiment of the present invention and a semiconductor device according to the conventional art.
Figure 2B:
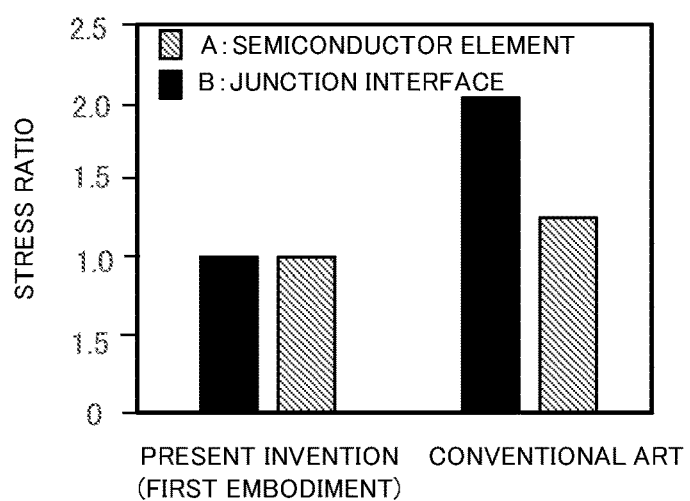
FIG. 2B illustrates a difference in advantageous effect between the semiconductor device according to the first embodiment of the present invention and the semiconductor device according to the conventional art.

FIG. 2A illustrates a difference in structure between the semiconductor device 100 according to the first embodiment of the present invention and a semiconductor device 101 according to the conventional art. FIG. 2B illustrates a difference in advantageous effect between the semiconductor device 100 according to the first embodiment of the present invention and the semiconductor device 101 according to the conventional art.

In FIG. 2A, the upper sectional structure of the semiconductor device 100 according the first embodiment and the lower top view on the left side are substantially equal to the sectional structure illustrated in FIG. 1A and the top view of FIG. 1B, respectively. However, the upper sectional structure corresponds to the sectional structure of the outer edge of the semiconductor device 100. Also in FIG. 2A, the upper sectional structure and the lower top view on the right side are of the semiconductor device 101 according to the conventional art. The upper sectional structure corresponds to a sectional structure of an outer edge of the semiconductor device 101.

FIG. 2B illustrates a result of comparison by calculation between stress applied to the semiconductor element 1 of the semiconductor device 100 according to the first embodiment and stress to be applied to a semiconductor element 1 of the conventional semiconductor device 101. In order to calculate the stress, the following conditions were set for each of the semiconductor device 100 according to the present embodiment and the semiconductor device 101 according to the conventional art.

As illustrated in FIG. 2A, in each of the first embodiment and the conventional art, the semiconductor element 1 had a chip size of 5 mm×5 mm. In the first embodiment, the 0.2 mm-wide low porosity region 3 in the sintered metal layer 2 was formed immediately below a position inward of the outer edge of the semiconductor element 1 by 1 mm. On the other hand, in the conventional art, a 0.2 mm-wide low porosity region 3 was formed immediately below an outer edge of the semiconductor element 1, that is, at an outer edge of a sintered metal layer 2. In each of the first embodiment and the conventional art, the sintered metal layer 2 was a 50 μm-thick sintered copper (Cu) layer.

In addition, the semiconductor element 1 was made of Si. The insulating member 5 was made of AlN. Each of the conductive member and the cooling member was made of Cu. A stress distribution in a case where the temperature of each of the semiconductor devices 100 and 101 was changed in a range from 200° C. to −40° C. was calculated by finite element analysis.

As a result of the calculation, the stress applied to the semiconductor element 1 in the first embodiment was reduced to about 1/1.3 at position A and reduced to about 1/2.1 at position B as compared with the stress applied to the semiconductor element 1 in the conventional art, as illustrated in FIG. 2B. As illustrated in FIG. 2A, position A is a central position of the outer peripheral end of the semiconductor element 1 in the vertical direction, and position B is a position of an outer peripheral end of an interface between the semiconductor element 1 and the sintered metal layer 2.

As described above, the stress applied to the semiconductor element 1 in the present embodiment is smaller than the stress applied to the semiconductor element 1 in the conventional art. In the present embodiment, therefore, the semiconductor element 1 is less susceptible to damage. As a result, there is a low possibility that the semiconductor element 1 is broken. There is also a low possibility that the semiconductor element 1 is separated from the sintered metal layer 2.

Figure 3:
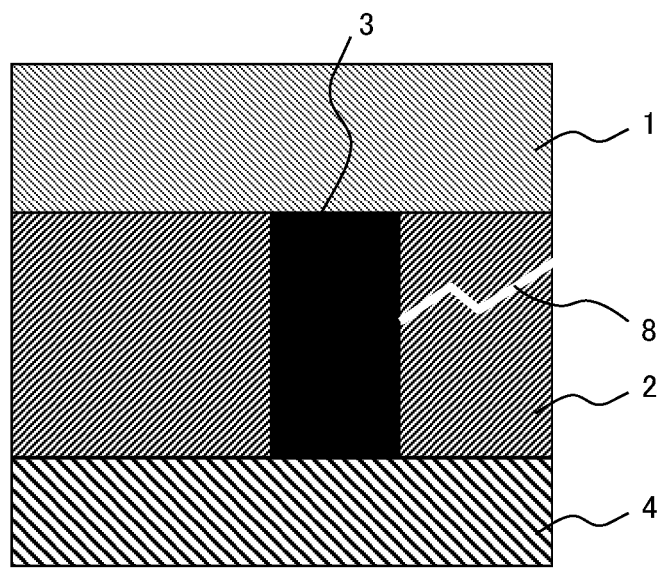
FIG. 3 schematically illustrates a state in which a crack in an end of a sintered metal layer of the semiconductor device according to the first embodiment of the present invention runs toward the center of the sintered metal layer, but is blocked by and stopped at a low porosity region.

FIG. 3 schematically illustrates a state in which a crack 8 in an end of the sintered metal layer 2 of the semiconductor device 100 according to the first embodiment runs toward the center of the sintered metal layer 2, but is blocked by and stopped at the low porosity region 3. In the present embodiment, since the outer edge of the sintered metal layer 2 is the high porosity region, a crack is apt to appear in the outer peripheral end. However, even when the crack in the outer peripheral end of the sintered metal layer 2 runs toward the center of the sintered metal layer 2, the wall-shaped low porosity region 3 located inward of the outer peripheral end blocks and stops the crack. In the low porosity region 3, since the density of holes is low, and the metal structure is dense, the crack is less likely to run. It can accordingly be expected that the present embodiment will produce an advantageous effect of suppressing running of the crack in the end of the sintered metal layer 2 toward the center of the sintered metal layer 2.

As described above, in the present embodiment, there is a low possibility that the semiconductor element 1 is separated from the sintered metal layer 2 or is broken due to stress derived from thermal variation, as compared with the conventional art. In addition, the crack in the end of the sintered metal layer 2 is stopped at the position of the low porosity region 3. The present embodiment therefore achieves the semiconductor device 100 that is resistant to thermal variation and excellent in reliability.

Second Embodiment

Figure 4A:
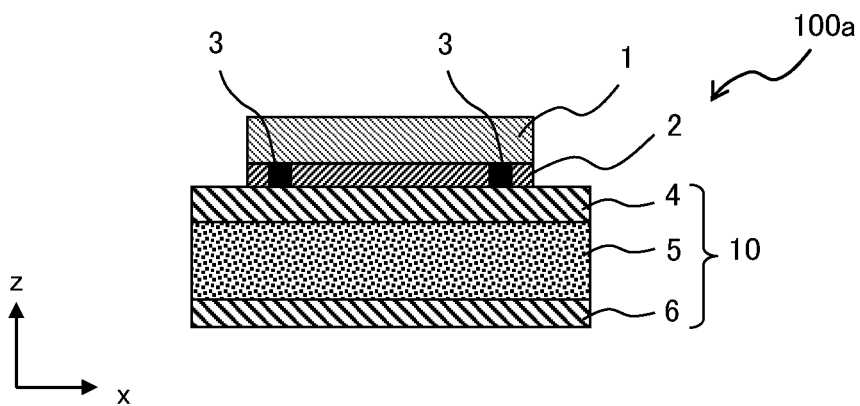
FIG. 4A illustrates an exemplary sectional structure of a semiconductor device according to a second embodiment of the present invention.
Figure 4B:
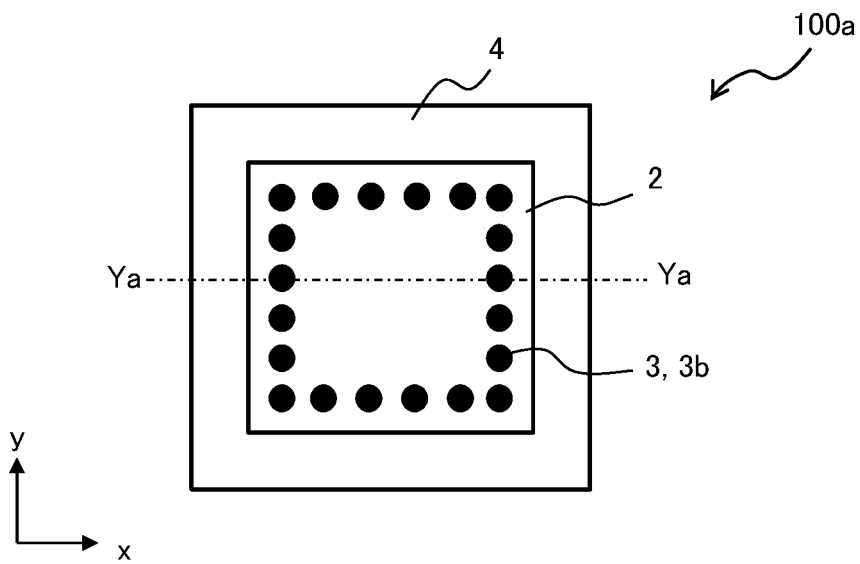
FIG. 4B illustrates an exemplary top view of the semiconductor device according to the second embodiment of the present invention.

FIG. 4A illustrates an exemplary sectional structure of a semiconductor device 100a according to a second embodiment of the present invention. FIG. 4B illustrates an exemplary top view of the semiconductor device 100a according to the second embodiment of the present invention. As illustrated in FIGS. 4A and 4B, the semiconductor device 100a has a configuration in which a semiconductor element 1 is bonded to a support substrate 10 with a sintered metal layer 2. The top view of FIG. 4B illustrates the semiconductor device 100a from which the semiconductor element 1 is removed. The sectional view of FIG. 4A illustrates the semiconductor device 100a including the semiconductor element 1, taken along line Ya-Ya in the plan view of FIG. 4B.

As can be easily understood from a comparison of FIGS. 4A and 4B with FIGS. 1A and 1B, the semiconductor device 100a according to the present embodiment is different from the semiconductor device 100 according to the first embodiment in a geometry of low porosity regions 3 in the sintered metal layer 2. The present embodiment is almost equal in structure to the first embodiment except the geometry of the low porosity regions 3; therefore, the following description is mainly given of the difference.

As illustrated in FIG. 4B, in the present embodiment, preferably, each low porosity region 3 has a round shape (e.g., a circular shape, an elliptical shape) as seen in plan view. Since stress tends to be concentratedly applied to a corner, each low porosity region 3 has the round shape in order to avoid the concentrated stress application. In addition, each low porosity region 3 has a pillar shape as seen in side view. However, this pillar is not necessarily a straight cylindrical pillar. For example, this pillar may be a curved pillar such as a barrel-shaped pillar or a constricted pillar. Alternatively, this pillar may be an obliquely inclined pillar. Preferably, this pillar has a diameter that is at least larger than a diameter of a hole in the sintered metal layer 2 and smaller than a thickness of the sintered metal layer 2. For example, the diameter of the pillar is about 5 μm to 100 μm.

In the present embodiment, as illustrated in FIG. 4B, the plurality of pillar-shaped low porosity regions 3 is disposed to surround a region immediately below a center of the semiconductor element 1 along an outer edge of the semiconductor element 1, in the sintered metal layer 2 at a position inward of the outer edge of the semiconductor element 1 with the sintered metal layer 2 bonded to the semiconductor element 1. The pillar-shaped low porosity regions 3 are not necessarily arranged in a single line as illustrated in FIG. 4B. For example, the pillar-shaped low porosity regions 3 may be arranged in multiple lines, may be arranged in a staggered shape, or may be arranged at random as long as they are disposed along the outer edge of the semiconductor element 1. It is however preferable that the planar shape of the arrangement have a symmetrical pattern for avoiding biased deformation owing to stress.

Also in the present embodiment, each low porosity region 3 has the following features. Each low porosity region 3 is made of a sintered metal bonding material obtained by sintering a paste material that is equal in composition to a paste material for the sintered metal layer 2. Each low porosity region 3 is lower in porosity than the remaining region. Preferably, the porosity of each low porosity region 3 is lower than the porosity of the region except the low porosity regions 3 in the sintered metal layer 2 by at least 10% or less. More preferably, the porosity of each low porosity region 3 is less than 10%.

As described above, according to the present embodiment, when a crack in an outer peripheral end of the sintered metal layer 2 runs toward the center of the sintered metal layer 2, then the crack is apt to collide with the low porosity regions 3. It can therefore be expected that the present embodiment will produce an advantageous effect of suppressing the running of the crack. In addition, each low porosity region 3 having a minute pillar shape exhibits flexibility against shear deformation. The present embodiment therefore suppresses separation of the semiconductor element 1 from the sintered metal layer 2 at an interface between the semiconductor element 1 and the sintered metal layer 2 and damage to peripheral members including the semiconductor element 1. Since each low porosity region 3 has a minute pillar shape, a crack tends to run in the thickness direction rather than a direction along the surface of the sintered metal layer 2. However, the crack running in the thickness direction does not impair the thermal conductivity and electric conductivity of the sintered metal layer 2. On the contrary, when the crack runs in the thickness direction, stress to be applied to the sintered metal layer 2 is reduced. It can therefore be expected that the present embodiment will produce an advantageous effect of suppressing occurrence of subsequent cracking and running of a subsequent crack.

Third Embodiment

Figure 5A:
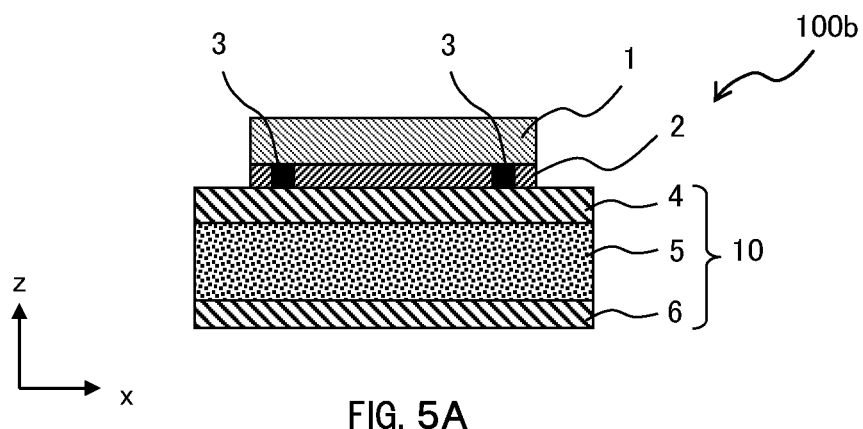
FIG. 5A illustrates an exemplary sectional structure of a semiconductor device according to a third embodiment of the present invention.
Figure 5B:
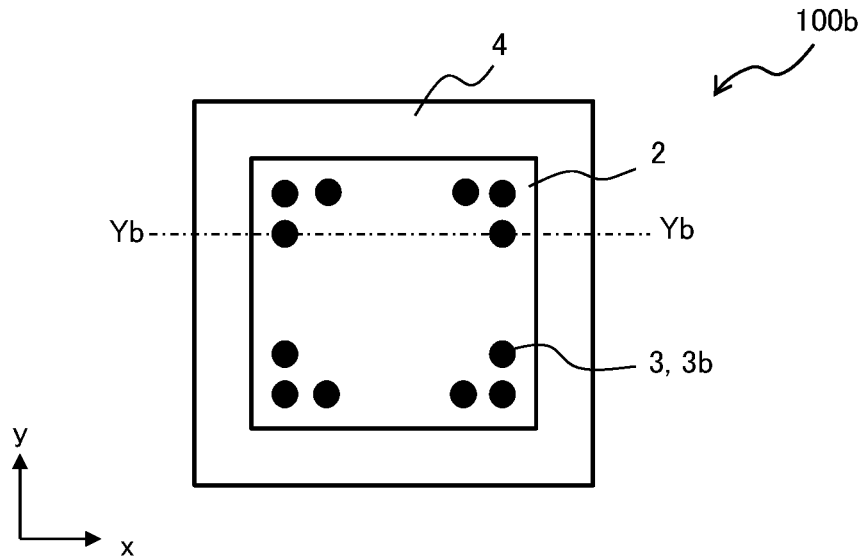
FIG. 5B illustrates an exemplary top view of the semiconductor device according to the third embodiment of the present invention.

FIG. 5A illustrates an exemplary sectional structure of a semiconductor device 100b according to a third embodiment of the present invention. FIG. 5B illustrates an exemplary top view of the semiconductor device 100b according to the third embodiment of the present invention. As illustrated in FIGS. 5A and 5B, the semiconductor device 100b has a configuration in which a semiconductor element 1 is bonded to a support substrate 10 with a sintered metal layer 2. The top view of FIG. 5B illustrates the semiconductor device 100b from which the semiconductor element 1 is removed. The sectional view of FIG. 5A illustrates the semiconductor device 100b including the semiconductor element 1, taken along line Yb-Yb in the plan view of FIG. 5B.

As can be easily understood from a comparison of FIGS. 5A and 5B with FIGS. 4A and 4B, the semiconductor device 100b according to the present embodiment is different from the semiconductor device 100*a* according to the second embodiment in an arrangement of pillar-shaped low porosity regions 3 in the sintered metal layer 2. The present embodiment is almost equal in structure to the second embodiment except the arrangement of the low porosity regions 3; therefore, the following description is mainly given of the difference.

Also in the present embodiment, the sintered metal layer 2 has the pillar-shaped low porosity regions 3 in a manner similar to that described in the second embodiment. In the present embodiment, as illustrated in FIG. 5B, the pillar-shaped low porosity regions 3 in the sintered metal layer 2 are disposed immediately below positions inward of an outer edge of the semiconductor element 1 and near four corners of the sintered metal layer 2.

This arrangement is made in consideration of a fact that, in a case where the sintered metal layer 2 has a quadrangular shape, cracks frequently appear in the four corners, to which stress is apt to be concentratedly applied, of the sintered metal layer 2. In the present embodiment, the pillar-shaped low porosity regions 3 are disposed near the four corners of the sintered metal layer 2 to efficiently suppress running of cracks in an end of the sintered metal layer 2. Also in the present embodiment, the number of pillar-shaped low porosity regions 3 in the sintered metal layer 2 is small. It can therefore be said that the present embodiment produces an advantageous effect of simplifying steps of a manufacturing process for forming the low porosity regions 3.

As illustrated in FIG. 5B, the number of low porosity regions 3 disposed near each corner of the sintered metal layer 2 is three. However, the number of low porosity regions 3 is not limited to three. In addition, any arrangement may be adopted as long as the low porosity regions 3 are arranged near each corner of the sintered metal layer 2. It is however preferable that the planar shape of the arrangement have a symmetrical pattern for avoiding biased deformation owing to stress.

Fourth Embodiment

Figure 6A:
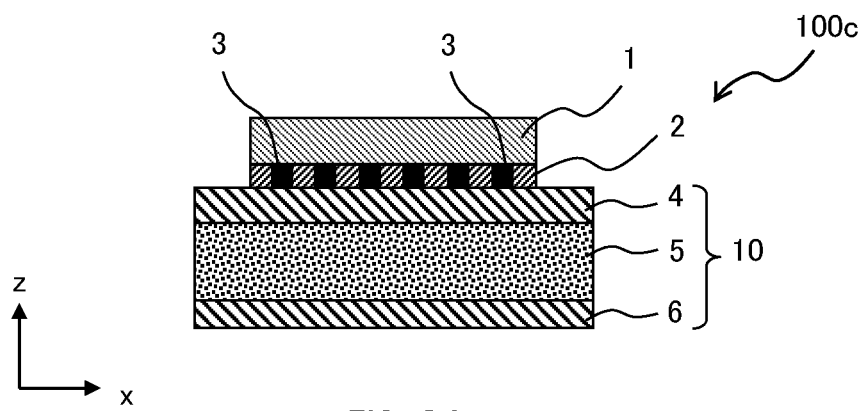
FIG. 6A illustrates an exemplary sectional structure of a semiconductor device according to a fourth embodiment of the present invention.
Figure 6B:
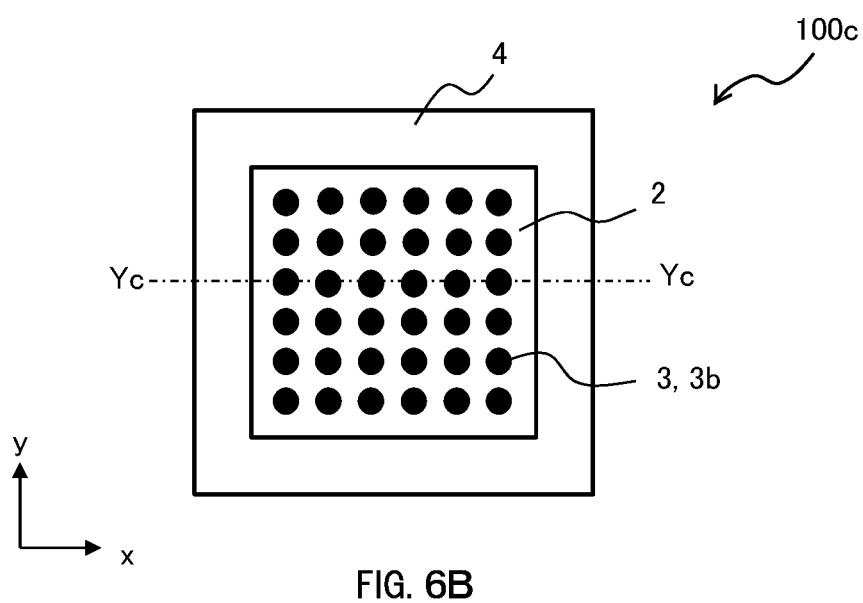
FIG. 6B illustrates an exemplary top view of the semiconductor device according to the fourth embodiment of the present invention.

FIG. 6A illustrates an exemplary sectional structure of a semiconductor device 100*c* according to a fourth embodiment of the present invention. FIG. 6B illustrates an exemplary top view of the semiconductor device 100*c* according to the fourth embodiment of the present invention. As illustrated in FIGS. 6A and 6B, the semiconductor device 100*c* has a configuration in which a semiconductor element 1 is bonded to a support substrate 10 with a sintered metal layer 2. The top view of FIG. 6B illustrates the semiconductor device 100*c* from which the semiconductor element 1 is removed. The sectional view of FIG. 6A illustrates the semiconductor device 100*c* including the semiconductor element 1, taken along line Yc-Yc in the plan view of FIG. 6B.

As can be easily understood from a comparison of FIGS. 6A and 6B with FIGS. 4A and 4B, the semiconductor device 100*c* according to the present embodiment is different from the semiconductor device 100*a* according to the second embodiment in an arrangement of pillar-shaped low porosity regions 3 in the sintered metal layer 2. The present embodiment is almost equal in structure to the second embodiment except the arrangement of the low porosity regions 3; therefore, the following description is mainly given of the difference.

Also in the present embodiment, the sintered metal layer 2 has the pillar-shaped low porosity regions 3 in a manner similar to that described in the second embodiment. In the present embodiment, as illustrated in FIG. 6B, the low porosity regions 3 are disposed immediately below a position inward of an outer edge of the semiconductor element 1 so as to spread over the entire sintered metal layer 2 at predetermined spacings. It can accordingly be expected that the present embodiment will also produce an advantageous effect of suppressing running of a crack in an end of the sintered metal layer 2 toward a center of the sintered metal layer 2 along a surface of the sintered metal layer 2.

In the present embodiment, the crack appearing in the sintered metal layer 2 is apt to run in the thickness direction. However, the crack in the thickness direction does not impair the thermal conductivity and electric conductivity of the sintered metal layer 2. On the contrary, when the crack runs in the thickness direction, stress to be applied to the sintered metal layer 2 is reduced. It can therefore be expected that the present embodiment will produce an advantageous effect of suppressing occurrence of subsequent cracking and running of a subsequent crack.

It can also be expected that the present embodiment will produce an advantageous effect of improving the heat dissipation and electric conductivity of the sintered metal layer 2 since the large number of pillar-shaped low porosity regions 3 excellent in thermal conductivity and electric conductivity are disposed over the entire region between the semiconductor element 1 and a conductive member 4 of the support substrate 10.

It should be noted that the pillar-shaped low porosity regions 3 are not necessarily arranged at regular spacings in the sintered metal layer 2 as illustrated in FIG. 6B as long as the large number of pillar-shaped low porosity regions 3 are disposed over the entire sintered metal layer 2 inward of the outer edge of the semiconductor element 1. It is however preferable that the arrangement have a symmetrical pattern as seen in plan view as a whole for avoiding biased deformation owing to stress.

Fifth Embodiment

Figure 7A:
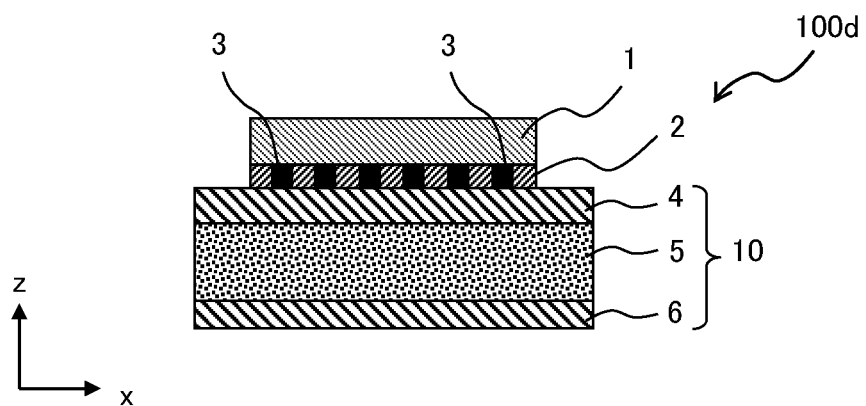
FIG. 7A illustrates an exemplary sectional structure of a semiconductor device according to a fifth embodiment of the present invention.
Figure 7B:
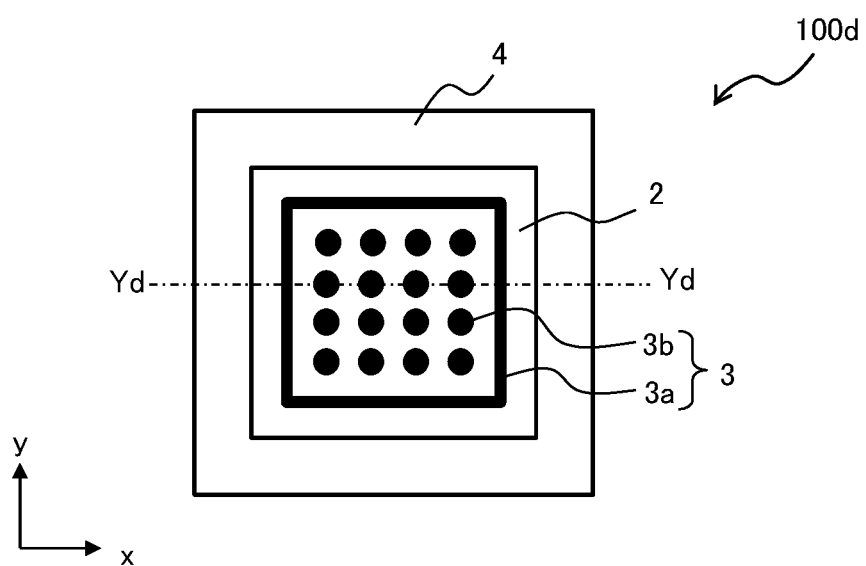
FIG. 7B illustrates an exemplary top view of the semiconductor device according to the fifth embodiment of the present invention.

FIG. 7A illustrates an exemplary sectional structure of a semiconductor device 100*d* according to a fifth embodiment of the present invention. FIG. 7B illustrates an exemplary top view of the semiconductor device 100*d* according to the fifth embodiment of the present invention. As illustrated in FIGS. 7A and 7B, the semiconductor device 100*d* has a configuration in which a semiconductor element 1 is bonded to a support substrate 10 with a sintered metal layer 2. The top view of FIG. 7B illustrates the semiconductor device 100*d* from which the semiconductor element 1 is removed. The sectional view of FIG. 7A illustrates the semiconductor device 100*d* including the semiconductor element 1, taken along line Yd-Yd in the plan view of FIG. 7B.

As can be easily understood from a comparison of FIGS. 7A and 7B with FIGS. 1A and 1B and FIGS. 6A and 6B, the semiconductor device 100*d* according to the present embodiment has a compromise structure between the structure of the semiconductor device 100 according to the first embodiment and the structure of the semiconductor device 100*c* according to the fourth embodiment. In the present embodiment, the sintered metal layer 2 has a wall-shaped low porosity region 3*a* and pillar-shaped low porosity regions 3*b*.

In this case, the wall-shaped low porosity region 3*a* in the sintered metal layer 2 is disposed to surround a region immediately below a center of the semiconductor element 1 along an outer edge of the semiconductor element 1, at a position inward of the outer edge of the semiconductor element 1 with the sintered metal layer 2 bonded to the semiconductor element 1, in a manner similar to that described in the first embodiment. In addition, the pillar-shaped low porosity regions 3b in the sintered metal layer 2 are disposed closer to the center of the semiconductor element 1 than the wall-shaped low porosity region 3a is.

It can accordingly be expected that the present embodiment will produce an advantageous effect of suppressing running of a crack in an end of the sintered metal layer 2 toward the center of the sintered metal layer 2 along a surface of the sintered metal layer 2. It can also be expected that the present embodiment will produce an advantageous effect of improving the heat dissipation and electric conductivity of the sintered metal layer 2.

Sixth Embodiment

Figure 8A:
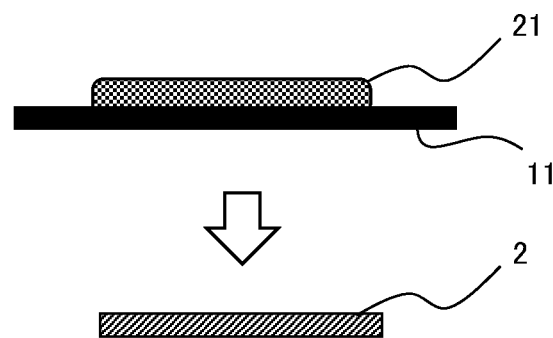
FIG. 8A illustrates an exemplary step of preparing a sheet of the sintered metal layer in a process of manufacturing the semiconductor device according to the first embodiment of the present invention.
Figure 8B:
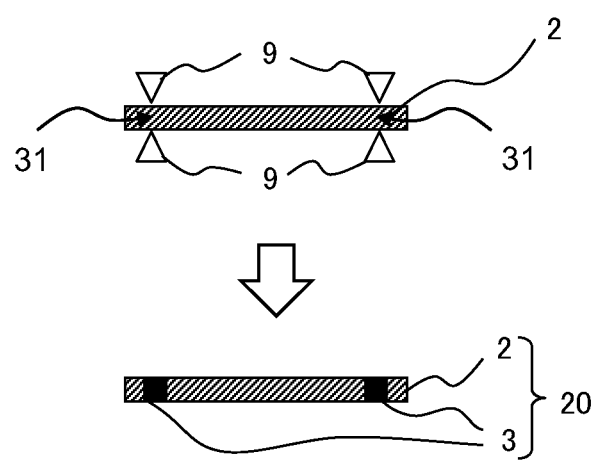
FIG. 8B illustrates an exemplary step of forming the low porosity region in the sintered metal layer to prepare a sintered metal sheet in the process of manufacturing the semiconductor device according to the first embodiment of the present invention.
Figure 8C:
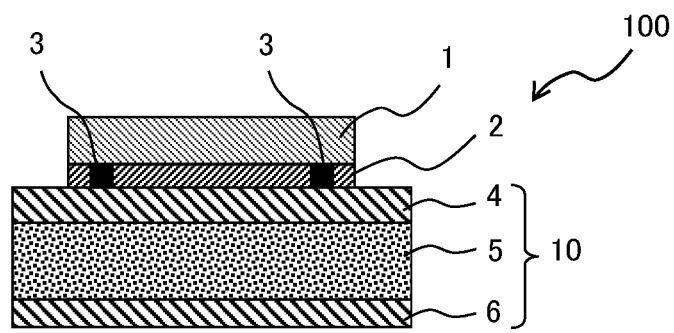
FIG. 8C illustrates an exemplary step of manufacturing the semiconductor device using the sintered metal sheet in the process of manufacturing the semiconductor device according to the first embodiment of the present invention.

FIG. 8A illustrates an exemplary step of preparing a sheet of the sintered metal layer 2 in a process of manufacturing the semiconductor device 100 according to the first embodiment of the present invention. FIG. 8B illustrates an exemplary step of forming the low porosity region 3 in the sintered metal layer 2 to prepare a sintered metal sheet 20. FIG. 8C illustrates an exemplary step of manufacturing the semiconductor device 100 using the sintered metal sheet 20. For convenience of the description, the sintered metal sheet 20 refers to a state in which the low porosity region 3 is formed in the sintered metal layer 2, and the sheet of the sintered metal layer 2 refers to a state before the low porosity region 3 is formed in the sintered metal layer 2. Although the sintered metal sheet 20 and the sheet of the sintered metal layer 2 are distinguished from each other, they should typically be called a sintered metal sheet.

In the step illustrated in FIG. 8A, first, a paste material 21, as a mixture of an organic solvent with metal fine particles within a range from several tens of nanometers to several hundreds of nanometers, is applied in a sheet form onto a plate 11 by, for example, a screen printing method or a dispensing method. Next, the paste material 21 is sintered at about 70° C. to 400° C., and then is removed from the plate 11. The sheet of the sintered metal layer 2 is thus obtained.

In the step illustrated in FIG. 8B, next, heat is locally applied to a portion, where the low porosity region 3 is to be formed, of the sheet of the sintered metal layer 2. The heating in this case can be achieved by, for example, local heating using a heater, local energization, or local pressurization. In this step, desired low porosity regions 3 can be formed in the sintered metal layer 2, using a heating jig, an energizing jig, or a pressurizing jig in accordance with the planar geometry of the low porosity region(s) 3 described in each of the first to fifth embodiments.

FIG. 8B illustrates an exemplary method of heating the sheet of the sintered metal layer 2 by local energization. Specifically, electrodes 9 are respectively placed on an upper surface and a lower surface of the sintered metal layer 2, in accordance with the planar geometry of the low porosity region 3 to energize a region 31, located between the upper electrodes 9 and the lower electrodes 9, in the sintered metal layer 2. Through the energization, the region 31, located between the upper electrodes 9 and the lower electrodes 9, in the sintered metal layer 2 is heated at a temperature higher than a sintering temperature for the sintered metal layer 2. As a result, the sintering locally proceeds at the region 31, located between the upper electrodes 9 and the lower electrodes 9, in the sintered metal layer 2. The sintered metal sheet 20 having the low porosity region 3 is thus prepared.

With regard to energization between an upper electrode 9 and a lower electrode 9, in the case of forming, for example, the plurality of pillar-shaped low porosity regions 3, a position corresponding to each pillar-shaped low porosity region 3 may be energized from above and below using the upper and lower electrodes 9. Alternatively, positions corresponding to the pillar-shaped low porosity regions 3 may be concurrently energized from above and below using a plurality of upper electrodes 9 and a plurality of lower electrodes 9. In the case of forming the wall-shaped low porosity region 3, the pair of upper and lower electrodes 9 is continuously moved along a predetermined path at a predetermined speed to form, for example, the wall-shaped low porosity region 3a illustrated in FIG. 1B.

In addition, a low porosity region 3 inclined relative to the vertical direction can be formed in the sintered metal layer 2 in such a manner that the positions of the electrodes 9 located above and below the sintered metal layer 2 are slightly displaced from each other in the plane direction.

The foregoing description concerns the example of forming the low porosity region 3 by heating the region 31 in the sintered metal layer 2 through energization using the upper and lower electrodes 9. The method of heating the region 31 is not limited to energization. For example, the region 31 may be locally heated by a heater or may be locally heated by pressurization. Preferably, a temperature for forming the low porosity region 3 is 200° C. or more in a case where the sintered metal layer 2 is made of sintered silver, and is 350° C. or more in a case where the sintered metal layer 2 is made of sintered copper.

The foregoing step of manufacturing the sintered metal sheet 20 has a major feature in that the entire sintered metal sheet 20 having the low porosity region 3 is made of a single material. That is, since the low porosity region 3 is made of the same material as that for the sintered metal layer 2, there arise no problems such as bonding failure and separation to be caused due to a difference in material. In addition, it can be expected as a merit of the foregoing process that, for example, the step of manufacturing the sintered metal sheet 20 will be simplified.

As illustrated in FIG. 8C, next, the sintered metal sheet 20 is placed on the conductive member 4 of the support substrate 10, the semiconductor element 1 is placed on the sintered metal sheet 20, and the sintered metal sheet 20 is bonded by sintering to the semiconductor element 1 and the support substrate 10 in a high-temperature environment of about 200° C. to 400° C. At this time, preferably, pressurization at 0.01 MPa or more is carried out concurrently with the heating for the purpose of achieving favorable sintering and bonding. In addition, an appropriate atmosphere such as a normal atmosphere, an atmosphere of N2, or an atmosphere of H2 can be selected in accordance with metal fine particles to be used herein.

The semiconductor device 100 is manufactured through the foregoing steps. FIGS. 8A to 8C illustrate the process of manufacturing the semiconductor device 100 according to the first embodiment; however, the description is applicable to processes of manufacturing the semiconductor devices 100a to 100d according to the second to fifth embodiments.

Figure 9:
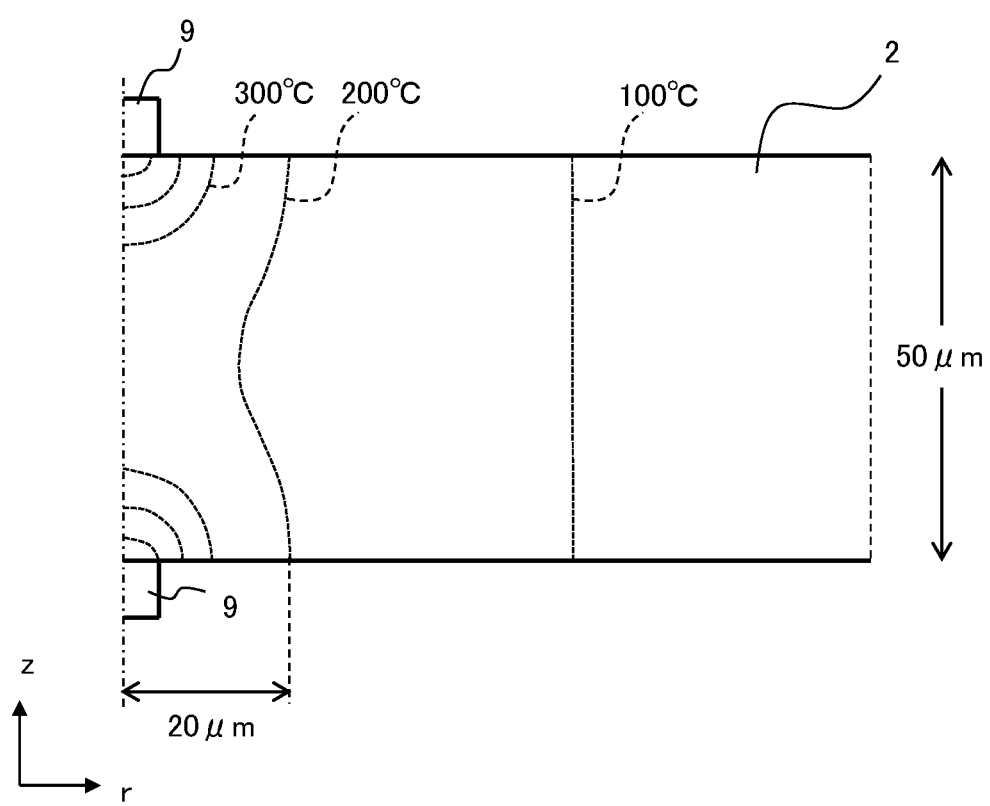
FIG. 9 illustrates an exemplary result of calculation, by a thermal analysis simulation, of a temperature distribution in the sintered metal layer that is heated by energization.

FIG. 9 illustrates a result of calculation, by a thermal analysis simulation, of a temperature distribution in the sintered metal layer 2 that is heated by energization. The thermal analysis simulation in this case is based on a two-dimensional axisymmetric model. Accordingly, the result of calculation corresponds to a temperature distribution in the case where the pillar-shaped low porosity regions 3 are formed.

The temperature distribution in the sintered metal layer 2 that is heated by energization is calculated on the assumption that the thickness of the sheet of the sintered metal layer 2 is 50 µm and the diameter of the region energized by the electrodes 9 is 6 µm. FIG. 9 illustrates the temperature distribution as the result of calculation in the form of an isotherm. In this case, the horizontal axis represents a distance from the center of each circular electrode 9, and the vertical axis represents a position of the sintered metal layer 2 in the thickness direction.

It is apparent from FIG. 9 that a region heated to 200° C. or more is formed into a pillar shape having a diameter of about 40 µm, and is constricted at its center in the thickness direction. In a case of using, for example, a material that starts to be sintered at 200° C. or more, a low porosity region 3 is formed into a pillar shape as described above.

According to the present embodiment, the low porosity region 3 in the sintered metal layer 2 can be formed in a fine structure or pattern that is difficult to achieve in the conventional art, by the method of forming the low porosity region 3 through particularly energization using the upper and lower electrodes 9. In the semiconductor device 100 manufactured using the sintered metal layer 2 having the low porosity region 3 formed therein (the sintered metal sheet 20), therefore, the stress in the sintered metal layer 2 is dispersed with ease. This enables a structure capable of preventing separation, occurrence of cracking, and running of a crack.

The present invention is not limited to the foregoing embodiments and modifications, and additional various modifications are included. For example, the foregoing embodiments and modifications have been described in detail for easy understanding of the present invention, and are not necessarily limited to those having all the described configurations. In addition, a part of the configuration of a certain embodiment or modification can be replaced with the configuration of another embodiment or modification, and the configuration of another embodiment or modification can be added to the configuration of a certain embodiment or modification. A part of the configuration of each embodiment or modification can be added to, deleted from, or replaced with the configuration of another embodiment or modification.

REFERENCE SIGNS LIST 1 semiconductor element
2 sintered metal layer
3 low porosity region
3a wall-shaped low porosity region
3b pillar-shaped low porosity region
4 conductive member
5 insulating member
6 cooling member
8 crack
9 electrode
10 support substrate
11 plate
20 sintered metal sheet
21 paste material
100, 100a, 100b, 100c, 100d semiconductor device

The invention claimed is:

1. A semiconductor device comprising:
a support substrate;
a semiconductor element; and
a sintered metal layer bonding the semiconductor element and the support substrate together, wherein
the sintered metal layer having a low porosity region disposed inward of an outer edge of the semiconductor element with the sintered metal layer bonded to the semiconductor element, the low porosity region being lower in porosity than a plurality of remaining regions, except the low porosity region, of the sintered metal layer,
the sintered metal layer has, as the low porosity region, a pillar-shaped low porosity region extending from an upper surface to a lower surface of the sintered metal layer,
a plurality of the pillar-shaped low porosity regions is disposed immediately below a position inward of the outer edge of the semiconductor element so as to spread over the entire sintered metal layer at predetermined spacings, and
the low porosity region separates the plurality of remaining regions into a first remaining region and a second remaining region, such that the first remaining region is on an outer edge of the low porosity region and the second remaining region is on an inner edge of the low porosity region.

2. The semiconductor device according to claim 1, wherein
the low porosity region of the sintered metal layer is made of a material that is equal to a material for the plurality of remaining regions of the sintered metal layer.

3. The semiconductor device according to claim 1, wherein
the sintered metal layer has, as the low porosity region, a wall-shaped low porosity region having an elongated string shape as seen in plan view and extending from an upper surface to a lower surface of the sintered metal layer,
the wall-shaped low porosity region is disposed to surround a region immediately below a center of the semiconductor element along the outer edge of the semiconductor element, and
a plurality of the pillar-shaped low porosity regions is disposed in an inner region surrounded with the wall-shaped low porosity region.

4. A sintered metal sheet to be interposed between a semiconductor element and a support substrate to bond the semiconductor element and the support substrate together, the sintered metal sheet comprising
a low porosity region disposed inward of an outer edge of the semiconductor element with the semiconductor element and the support substrate bonded together, the low porosity region being lower in porosity than a plurality of remaining regions, except the low porosity region, of the sintered metal sheet, and
the sintered metal layer has, as the low porosity region, a pillar-shaped low porosity region extending from an upper surface to a lower surface of the sintered metal layer,
a plurality of the pillar-shaped low porosity regions is disposed immediately below a position inward of the outer edge of the semiconductor element so as to spread over the entire sintered metal layer at predetermined spacings, and
the low porosity region separates the plurality of remaining regions into a first remaining region and a second remaining region, such that the first remaining region is on an outer edge of the low porosity region and the second remaining region is on an inner edge of the low porosity region.

5. The sintered metal sheet according to claim 4, wherein the low porosity region is made of a material that is equal to a material for the plurality of remaining regions.

6. A method for manufacturing a sintered metal sheet, the method comprising:
preparing a sintered metal sheet by sintering a paste material containing a metal fine particle; and
forming a low porosity region lower in porosity than a plurality of remaining regions, except the low porosity region, of the sintered metal sheet, by placing a pair of electrodes on an upper surface and a lower surface of the sintered metal sheet at predetermined positions of the sintered metal sheet, and energizing a region of the sintered metal sheet, the region being located between the electrodes, and
wherein in forming the low porosity region, the plurality of remaining regions are separated into a first remaining region and a second remaining region, such that the first remaining region is on an outer edge of the low porosity region and the second remaining region is on an inner edge of the low porosity region.

7. The method according to claim 6, wherein
in forming the low porosity region, the electrodes are placed on the upper surface and the lower surface of the sintered metal sheet at positions inward of an outer edge of the sintered metal sheet.

* * * * *